(12) United States Patent
Lee et al.

(10) Patent No.: US 10,025,731 B1
(45) Date of Patent: Jul. 17, 2018

(54) MEMORY MODULE AND CIRCUIT PROVIDING LOAD ISOLATION AND NOISE REDUCTION

(71) Applicant: Netlist, Inc., Irvine, CA (US)

(72) Inventors: Hyun Lee, Ladera Ranch, CA (US); Jayesh R. Bhakta, Cerritos, CA (US); Jeffrey C. Solomon, Irvine, CA (US); Mario Jesus Martinez, Laguna Niguel, CA (US); Chi-She Chen, Walnut, CA (US)

(73) Assignee: NETLIST, INC., Seocho-Gu (KR)

( * ) Notice: Subject to any disclaimer, the term of this patent is extended or adjusted under 35 U.S.C. 154(b) by 108 days.

(21) Appl. No.: 14/715,491

(22) Filed: May 18, 2015

Related U.S. Application Data

(63) Continuation of application No. 14/324,990, filed on Jul. 7, 2014, now Pat. No. 9,037,809, which is a
(Continued)

(51) Int. Cl.
*G06F 12/00* (2006.01)
*G06F 13/16* (2006.01)
(Continued)

(52) U.S. Cl.
CPC ...... *G06F 13/1684* (2013.01); *G06F 13/4027* (2013.01); *G11C 5/02* (2013.01); *G11C 5/06* (2013.01); *G11C 8/18* (2013.01)

(58) Field of Classification Search
CPC ... G06F 12/1684; G06F 13/4027; G11C 5/02; G11C 5/06; G11C 8/18
See application file for complete search history.

(56) References Cited

U.S. PATENT DOCUMENTS

| 4,739,473 A | 4/1988 | Ng |
| 5,313,624 A | 5/1994 | Harriman |

(Continued)

FOREIGN PATENT DOCUMENTS

WO    WO99/30240    6/1999

OTHER PUBLICATIONS

Non-Final Office Action, U.S. Appl. No. 13/970,606, filed Aug. 20, 2013, dated Nov. 23, 2015.
(Continued)

*Primary Examiner* — Gurtej Bansal
(74) *Attorney, Agent, or Firm* — Morgan, Lewis & Bockius LLP

(57) ABSTRACT

Certain embodiments described herein include a memory module having a printed circuit board including at least one connector configured to be operatively coupled to a memory controller of a computer system. The memory module further includes a plurality of memory devices on the printed circuit board and a circuit including a first set of ports operatively coupled to at least one memory device. The circuit further includes a second set of ports operatively coupled to the at least one connector. The circuit includes a switching circuit configured to selectively operatively couple one or more ports of the second set of ports to one or more ports of the first set of ports. Each port of the first set and the second set comprises a correction circuit which reduces noise in one or more signals transmitted between the first set of ports and the second set of ports.

18 Claims, 9 Drawing Sheets

Related U.S. Application Data continuation of application No. 13/412,243, filed on Mar. 5, 2012, now Pat. No. 8,782,350, which is a continuation of application No. 12/422,853, filed on Apr. 13, 2009, now Pat. No. 8,154,901.

(60) Provisional application No. 61/044,839, filed on Apr. 14, 2008, provisional application No. 61/044,825, filed on Apr. 14, 2008, provisional application No. 61/044,801, filed on Apr. 14, 2008.

(51) Int. Cl.
| | | |
|---|---|---|
| *G11C 5/02* | | (2006.01) |
| *G11C 5/06* | | (2006.01) |
| *G11C 8/18* | | (2006.01) |
| *G06F 13/40* | | (2006.01) |

(56) References Cited

U.S. PATENT DOCUMENTS

| | | | |
|---|---|---|---|
| 5,630,096 | A | 5/1997 | Zuravleff |
| 5,905,401 | A | 5/1999 | Sher |
| 6,061,754 | A | 5/2000 | Cepulis |
| 6,141,245 | A | 10/2000 | Bertin |
| 6,233,650 | B1 | 5/2001 | Johnson |
| 6,262,938 | B1 | 7/2001 | Lee |
| 6,381,140 | B1 | 4/2002 | Liao |
| 6,546,476 | B1 | 4/2003 | Gillingham |
| 6,636,446 | B2 | 10/2003 | Lee |
| 6,704,910 | B2 | 3/2004 | Hong |
| 7,024,518 | B2 | 4/2006 | Halbert et al. |
| 7,191,302 | B2 | 3/2007 | Usami |
| 7,225,303 | B2 | 5/2007 | Choi |
| 7,254,036 | B2 | 8/2007 | Pauley |
| 7,730,254 | B2 | 6/2010 | Risse |
| 7,990,746 | B2 | 8/2011 | Rajan |
| 8,244,971 | B2 | 8/2012 | Rajan |
| 8,335,894 | B1 | 12/2012 | Rajan |
| 8,856,464 | B2 | 10/2014 | Karamcheti |
| 2001/0008006 | A1 | 7/2001 | Klein |
| 2002/0038405 | A1 | 3/2002 | Leddige et al. |
| 2003/0070052 | A1 | 4/2003 | Lai |
| 2008/0025137 | A1 | 1/2008 | Rajan et al. |
| 2008/0162790 | A1 | 7/2008 | Im |
| 2009/0248969 | A1 | 10/2009 | Wu |
| 2009/0296503 | A1 | 12/2009 | Chu et al. |
| 2010/0125681 | A1 | 5/2010 | Patel |
| 2011/0085406 | A1 | 4/2011 | Solomon et al. |

OTHER PUBLICATIONS

Response to Non-Final Office Action, U.S. Appl. No. No. 13/970,606, filed Aug. 20, 2013, dated Mar. 23, 2016.
Inter Partes Review Case No. 2014-00882, Patent Owner Response, filed May 8, 2015.
Inter Partes Review Case No. 2014-00882, Petitioner Diablo Technologies, Inc.'s Reply to Patent Owner Netlist, Inc.'s Response, filed Jun. 19, 2015.
Inter Partes Review Case No. 2014-00882, Petitioner's Request for Oral Argument, filed Jul. 1, 2015.
Inter Partes Review Case No. 2014-00882, Patent Owner's Request for Oral Argument, filed Jul. 3, 2015.
Inter Partes Review Case No. 2014-00882, Order—Request for Oral Argument—37 C.F.R. 42.70, filed Jul. 10, 2015.
Inter Partes Review Case No. 2014-00882, Record of Oral Hearing, filed Nov. 16, 2015.
Inter Partes Review Case No. 2014-00882, Final Written Decision 35 USC 318 and 37 CFR 42.73, filed Dec. 14, 2015.
Inter Partes Review Case No. 2014-00882, Netlist Inc.'s Notice of Appeal, filed Feb. 10, 2016.
Inter Partes Review Case No. 2014-00882, Exhibit 1022, 'Professor Carl Sechen Deposition Transcript,' filed Jun. 19,2015.
Inter Partes Review Case No. 2014-00882, Exhibit 1023, 'Dr. Srinivasan Jagannathan Supplemental Declaration,' filed Jun. 19, 2015.
Inter Partes Review Case No. 2014-00882, Exhibit 2002, 'Declaration of Professor Carl Sechen,' filed May 8, 2015.
Inter Partes Review Case No. 2014-00882, Exhibit 2003, 'Transcript of Videotaped Deposition of Srinivasan Jagannathan, Ph. D,' filed May 8, 2015.
Microsoft Computer Dictionary, Fifth Edition, Microsoft Press, p. 334, 2002.
Jacob, Bruce, et al. "Memory Systems—Cache, DRAM, Disk," Elsevier Inc. 2008, Chapters 7 and 10.
U.S. District Court Northern District of California, Case No. 4.13-cn-05889-YGR, *Netlist Inc.* v. *Smart Storage Systems, Inc., and Diablo Technologies, Inc.*, Joint Claim Construction and Prehearing Statement Pursuant to Patent L. T. 4-3, filed Aug. 27, 2014, in 28 pages.
Excerpts from the Authoritative Dictionary of IEEE Standard Terms, Seventh Edition, Standards Information Network, IEEE Press (2000), pp. 349-411.
Excerpts from the Authoritative Dictionary of IEEE Standard Terms, Seventh Edition, Standards Information Network, IEEE Press (2000), pp. 133-265.
Selected Entries in Oxford English Dictionary, Oxford University Press 2014, http://www.oed.com/view/Entry/175039?redirectedFrom=selectively#eid.
Web search results from the Oxford English Dictionary, Oxford University Press 2014, http://www.oed.com/search?searchType=dictionary&q=select&_searchBin=Search.
Inter Partes Review Case No. 2014-00883, Patent Owner Response, filed May 8, 2015.
Inter Partes Review Case No. 2014-00883, Petitioner Diablo Technologies, Inc.'s Reply to Patent Owner Netlist, Inc.'s Response, filed Jun. 19, 2015.
Inter Partes Review Case No. 2014-00883, Petitioner's Request for Oral Argument, filed Jul. 1, 2015.
Inter Partes Review Case No. 2014-00883, Patent Owner's Request for Oral Hearing, filed Jul. 3, 2015.
Inter Partes Review Case No. 2014-00883, Order—Request for Oral Argument—37 C.F.R. 42.70, filed Jul. 10, 2015.
Inter Partes Review Case No. 2014-00883, Record of Oral Hearing, filed Nov. 16, 2015.
Inter Partes Review Case No. 2014-00883, Final Written Decision—35 USC 318 and 37 CFR 42.73, filed Dec. 14, 2015.
Inter Partes Review Case No. 2014-00883, Netlist Inc.'s Notice of Appeal, filed Feb. 10, 2016.
Inter Partes Review Case No. 2014-00883, Exhibit 1025, 'Professor Carl Sechen Deposition Transcript,' filed Jun. 19, 2015.
Inter Partes Review Case No. 2014-00883, Exhibit 1026, 'Dr. Srinivasan Jagannathan Supplemental Declaration,' filed Jun. 19, 2015.
Inter Partes Review Case No. 2014-01011, Patent Owner Response, filed May 8, 2015.
Inter Partes Review Case No. 2014-01011, Petitioner Diablo Technologies, Inc.'s Reply to Patent Owner Netlist, Inc.'s Response, filed Jun. 19, 2015.
Inter Partes Review Case No. 2014-01011, Petitioner's Request for Oral Argument, filed Jul. 1, 2015.
Inter Partes Review Case No. 2014-01011, Patent Owner's Request for Oral Hearing, filed Jul. 3, 2015.
Inter Partes Review Case No. 2014-01011, Order—Request for Oral Argument—37 C.F.R. 42.70, filed Jul. 10, 2015.
Inter Partes Review Case No. 2014-01011, Record of Oral Hearing, filed Nov. 16, 2015.
Inter Partes Review Case No. 2014-01011, Final Written Decision—35 USC 318 and 37 CFR 42.73, filed Dec. 14, 2015.
Inter Partes Review Case No. 2014-01011, Netlist Inc.'s Notice of Appeal, filed Feb. 10, 2016.
Inter Partes Review Case No. 2014-01011, Exhibit 1027, 'Professor Carl Sechen Deposition Transcript,' filed Jun. 19,2015.
Inter Partes Review Case No. 2014-01011, Exhibit 1028, 'Dr. Srinivasan Jagannathan Supplemental Declaration,' filed Jun. 19, 2015.

(56) References Cited

OTHER PUBLICATIONS

Inter Partes Review of U.S. Pat. No. 7,881,150, Case No. IPR2015-01020, Record of Oral Hearing, dated Jul. 26, 2016.
Inter Partes Review of U.S. Pat. No. 7,881,150, Case No. IPR2015-01020, Final Written Decision, issued Sep. 28, 2016.
Inter Partes Review of U.S. Pat. No. 7,881,150, Case No. IPR2015-01020, Exhibit 3001 to Final Decision, issued Sep. 28, 2016.
Inter Partes Review of U.S. Pat. No. 7,881,150, Case No. IPR2015-01020, Exhibit 3001-2 to Final Decision, issued Sep. 28, 2016.
Inter Partes Review of U.S. Pat. No. 7,881,150, Case No. IPR2015-01020, Exhibit 3002 to Final Decision, issued Sep. 28, 2016.
Inter Partes Review of U.S. Pat. No. 7,881,150, Case No. IPR2015-01020, Exhibit 3003 to Final Decision, issued Sep. 28, 2016.
Inter Partes Review of U.S. Pat. No. 7,881,150, Case No. IPR2015-01020, Exhibit 3004 to Final Decision, issued Sep. 28, 2016.
Inter Partes Review of U.S. Pat. No. 8,081,536, Case No. IPR2015-01021, Final Decision, issued Sep. 28, 2016.
Inter Partes Review of U.S. Pat. No. 8,756,364, Case No. IPR2017-00549, Petition for Inter Partes Review, filed Dec. 30, 2016.
Inter Partes Review of U.S. Pat. No. 8,756,364, Case No. IPR2017-00549, Exhibit 1003, "Declaration of Harold S. Stone," filed Dec. 30, 2016.
Inter Partes Review of U.S. Pat. No. 8,516,185, Case No. IPR2017-00577, Petition for Inter Partes Review, filed Jan. 5, 2017.
Inter Partes Review of U.S. Pat. No. 8,516,185, Case No. IPR2017-00577, Exhibit 1003, "Declaration of Harold S. Stone," filed Jan. 5, 2017.
Inter Partes Review of U.S. Pat. No. 8,756,364, Case No. IPR2017-00549, Exhibit 1008, Declaration of John J. Kelly Regarding Records of Joint Electron Device Engineering Council (JEDEC), filed Dec. 30, 2016.
JEDEC Standard Double Data Rate (DDR) SDRAM Specification, JESD79 (Jun. 2000).
Texas Instruments SN74LS245 octal bus transceivers with 3-state outputs datasheet, 2002.
Stone, H.S. Microcomputer Interfacing, Reading, MA: Addison Wesley, 1982.
128Mbit SDRAM, Samsung datasheet K4S281632C, Rev. 00. Mar. 2000.
G. Moore, "Cramming more components onto integrated circuits," Electronics, vol. 38, No. 8, Apr. 19, 1965.
Inter Partes Review of U.S. Pat. No. 7,881,150, Case No. IPR2015-01020, Related Matters, filed Apr. 28, 2015.
Inter Partes Review of U.S. Pat. No. 7,881,150, Case No. IPR2015-01020, Patent Owner Response to Petition, filed Feb. 22, 2016.
Inter Partes Review of U.S. Pat. No. 7,881,150, Case No. IPR2015-01020, Petitioner's Objections to Evidence, filed Feb. 29, 2016.
Inter Partes Review of U.S. Pat. No. 7,881,150, Case No. IPR2015-01020, Petitioner's Reply, filed May 19, 2016.
Inter Partes Review of U.S. Pat. No. 7,881,150, Case No. IPR2015-01020, Petitioner Request for Oral Argument, filed Jun. 2, 2016.
Inter Partes Review of U.S. Pat. No. 7,881,150, Case No. IPR2015-01020, Patent Owner Motion for Observations, filed Jun. 2, 2016.
Inter Partes Review of U.S. Pat. No. 7,881,150, Case No. IPR2015-01020, Patent Owner Request for Oral Argument, filed Jun. 2, 2016.
Inter Partes Review of U.S. Pat. No. 7,881,150, Case No. IPR2015-01020, Order Trial Hearing, filed Jun. 8, 2016.
Inter Partes Review of U.S. Pat. No. 7,881,150, Case No. IPR2015-01020, Patent Owner's Submission on Propriety of Petitioner Reply, filed Jun. 9, 2016.
Inter Partes Review of U.S. Pat. No. 7,881,150, Case No. IPR2015-01020, Petitioner's Response to Motion for Observations, filed Jun. 10, 2016.
Inter Partes Review of U.S. Pat. No. 7,881,150, Case No. IPR2015-01020, Petitioner's Response to Netlist's Submission, filed Jun. 13, 2016.
Inter Partes Review of U.S. Pat. No. 7,881,150, Case No. IPR2015-01020, Patent Owner's Objections to Petitioner's Demonstrative Exhibits, filed Jun. 23, 2016.
Inter Partes Review of U.S. Pat. No. 7,881,150, Case No. IPR2015-01020, Patent Owner's Demonstrative Exhibits, filed Jun. 24, 2016.
Inter Partes Review of U.S. Pat. No. 7,881,150, Case No. IPR2015-01020, Petitioner's Updated Exhibit List, filed Jun. 24, 2016.
Inter Partes Review of U.S. Pat. No. 7,881,150, Case No. IPR2015-01020, Supplemental Declaration of Dr. Jagannathan, filed May 19, 2016.
Inter Partes Review of U.S. Pat. No. 7,881,150, Case No. IPR2015-01020, May 10, 2016 Deposition of Carl Sechen, filed May 19, 2016.
Inter Partes Review of U.S. Pat. No. 7,881,150, Case No. IPR2015-01020, Petitioner's Demonstrative Exhibits, filed Jun. 24, 2016.
Inter Partes Review of U.S. Pat. No. 7,881,150, Case No. IPR2015-01020, Exhibit 2001, "Declaration of Professor Carl Sechen," filed Feb. 22, 2016.
Inter Partes Review of U.S. Pat. No. 7,881,150, Case No. IPR2015-01020, Exhibit 2002, "Videotaped Deposition of Srinivasan Jagannathan, Ph.D on Feb. 12, 2016," filed Feb. 22, 2016.
Inter Partes Review of U.S. Pat. No. 7,881,150, Case No. IPR2015-01020, Exhibit 2003, "Videotaped Deposition of Srinivasan Jagannathan, Ph.D on Apr. 20, 2015," filed Feb. 22, 2016.
Inter Partes Review of U.S. Pat. No. 7,881,150, Case No. IPR2015-01020, Exhibit 2007, "Deposition of Dr. Srinivasan Jagannathan on May 25, 2016," filed Jun. 2, 2016.
Inter Partes Review of U.S. Pat. No. 8,081,536, Case No. IPR2015-01021, Patent Owner Response to Petition, filed Feb. 22, 2016.
Inter Partes Review of U.S. Pat. No. 8,081,536, Case No. IPR2015-01021, Petitioner's Objections to Evidence, filed Feb. 29, 2016.
Inter Partes Review of U.S. Pat. No. 8,081,536, Case No. IPR2015-01021, Petitioner's Reply, filed May 19, 2016.
Inter Partes Review of U.S. Pat. No. 8,081,536, Case No. IPR2015-01021, Petitioner Request for Oral Argument, filed Jun. 2, 2016.
Inter Partes Review of U.S. Pat. No. 8,081,536, Case No. IPR2015-01021, Patent Owner Motion for Observations, filed Jun. 2, 2016.
Inter Partes Review of U.S. Pat. No. 8,081,536, Case No. IPR2015-01021, Patent Owner Request for Oral Argument, filed Jun. 2, 2016.
Inter Partes Review of U.S. Pat. No. 8,081,536, Case No. IPR2015-01021, Patent Owner's Submission on Propriety of Petitioner Reply, filed Jun. 9, 2016.
Inter Partes Review of U.S. Pat. No. 8,081,536, Case No. IPR2015-01021, Petitioner's Response to Motion for Observations, filed Jun. 10, 2016.
Inter Partes Review of U.S. Pat. No. 8,081,536, Case No. IPR2015-01021, Petitioner's Response to Patent Owner's Submission, filed Jun. 13, 2016.
Inter Partes Review of U.S. Pat. No. 8,081,536, Case No. IPR2015-01021, Patent Owner's Objections to Petitioner's Demonstrative Exhibits, filed Jun. 23, 2016.
Inter Partes Review of U.S. Pat. No. 8,081,536, Case No. IPR2015-01021, Patent Owner's Demonstrative Exhibits, filed Jun. 24, 2016.
Inter Partes Review of U.S. Pat. No. 8,081,536, Case No. IPR2015-01021, Petitioner's Updated Exhibit List, filed Jun. 24, 2016.
Inter Partes Review of U.S. Pat. No. 8,081,536, Case No. IPR2015-01021, Supplemental Declaration of Dr. Jagannathan, filed May 19, 2016.
Inter Partes Review of U.S. Pat. No. 8,081,536, Case No. IPR2015-01021, Exhibit 2001, "Declaration of Professor Carl Sechen," filed Feb. 22, 2016.
International Search Report and Written Opinion, International Application No. PCT/US14/48517, filed Jul. 28, 2014, dated Oct. 27, 2014.
Inter Partes Review Case No. IPR2014-01029, Petitioner's Request for Rehearing pursuant to 37 C.F.R. § 42.71, filed on Jan. 15, 2015.
Inter Partes Review Case No. IPR2014-01029, Decision Denying Request for Rehearing, Issued on Mar. 3, 2015.
Inter Partes Review Case No. IPR2014-01369, Decision Denying Institution of Inter Partes Review 37 C.F.R. § 42.108, issued Mar. 9, 2014.
Examination Report, European Patent Application No. 10730021.2, dated Apr. 14, 2014.
Response to Examination Report, European Patent Application No. 10730021.2, dated Jun. 4, 2014.

(56) References Cited

OTHER PUBLICATIONS

Examination Report, European Patent Application No. 10730021.2, dated Apr. 29, 2015.
Response to Examination Report, European Patent Application No. 10730021.2, dated Apr. 29, 2015, filed Nov. 4, 2015.
English Translation of the Notice of Grounds for Rejection, Korean Patent Application No. 2012-7004038, dated May 11, 2016.
Notice of Allowance, U.S. Appl. No. 13/970,606, filed Aug. 20, 2013, dated Jun. 27, 2016.

MEMORY MODULE AND CIRCUIT PROVIDING LOAD ISOLATION AND NOISE REDUCTION

CROSS-REFERENCE TO RELATED APPLICATIONS

The present application is a continuation of U.S. patent application Ser. No. 14/324,990, filed Jul. 7, 2014, which is a continuation of U.S. patent application Ser. No. 13/412,243, filed Mar. 5, 2012, now U.S. Pat. No. 8,782,350, which is a continuation of U.S. patent application Ser. No. 12/422,853, filed Apr. 13, 2009, now U.S. Pat. No. 8,154,901, which claims the benefit of priority from U.S. Provisional Appl. No. 61/044,839, filed Apr. 14, 2008, from U.S. Provisional Appl. No. 61/044,825, filed Apr. 14, 2008, and from U.S. Provisional Appl. No. 61/044,801, filed Apr. 14, 2008, each of which are incorporated in its entirety by reference herein. This application is also related to U.S. patent application Ser. No. 12/422,912, filed on Apr. 13, 2009, now abandoned, and U.S. patent application Ser. No. 12/422,925, filed on Apr. 13, 2009, now U.S. Pat. No. 8,001,434, both of which are incorporated in their entirety by reference herein. This application is further related to U.S. patent application Ser. No. 13/183,253, filed Jul. 14, 2011, now U.S. Pat. No. 8,359,501, U.S. patent application Ser. No. 13/745,790, filed Jan. 19, 2013, now U.S. Pat. No. 8,689,064, and U.S. patent application Ser. No. 14/229,844, filed Mar. 29, 2014. This application is further related to U.S. patent application Ser. No. 12/422,912, filed on Apr. 13, 2009, now abandoned, U.S. patent application Ser. No. 12/422,925, filed on Apr. 13, 2009, now U.S. Pat. No. 8,001,434, U.S. patent application Ser. No. 13/183,253, filed Jul. 14, 2011, now U.S. Pat. No. 8,359,501, U.S. patent application Ser. No. 13/745,790, filed Jan. 19, 2013, now U.S. Pat. No. 8,689,064, U.S. patent application Ser. No. 14/299,844, filed Mar. 29, 2014, U.S. patent application Ser. No. 12/504,131, filed Jul. 16, 2009, now U.S. Pat. No. 8,417,870, U.S. patent application Ser. No. 12/761,179, filed Apr. 15, 2010, now U.S. Pat. No. 8,516,185, U.S. patent application Ser. No. 13/970,606, filed Aug. 20, 2013, U.S. patent application Ser. No. 13/287,042, filed Nov. 1, 2011, now, U.S. Pat. No. 8,756,364, U.S. patent application Ser. No. 13/971,231, filed Aug. 20, 2013, and U.S. application Ser. No. 13/288,850, filed Nov. 3, 2011.

BACKGROUND

The present application relates generally to the field of electrical signal integrity and more specifically to circuits for improving electrical signal integrity. Description of the Related Art As the demand on the performance of electronic systems increase, the systems include higher speed processors and higher memory densities with relatively heavy fan-outs. However, higher speed processors and higher memory densities translate to higher power dissipation and increased memory access time, impairing the performance of the system.

Traditional systems sometimes incorporate multiplexers and/or demultiplexers to help quiet inactive signal paths, minimizing the overall dynamic power dissipation, and isolating unused subsystems. FIG. 1 schematically illustrates an example of such a system 10 which incorporates a multiplexer-demultiplexer 12 to isolate unused subsystems of a plurality of subsystems 16, 18. This arrangement can reduce the load on each driver 14 when the original signal path includes multiple destinations by inserting a multiplexer on each signal path between the driver 14, the receiver 20 and the multiple destinations. However, the multiplexer and/or demultiplexer 12 can present transmission line discontinuity regions in electronic systems (e.g., in electronic systems with signal paths with electrical lengths longer than ¼ of the wavelength of the operational frequency or the signal transition rate). In such systems, signal reflections may occur, changing wave characteristics and degrading system performance. These signal reflections may cause signal distortions and signal integrity issues which can contribute to reduced system performance and eventual failure of the system, thereby limiting the effectiveness of the multiplexer and/or demultiplexer in addressing the signal integrity and power dissipation issues.

In memory applications, some systems control "chip select" or device select signals, along with the memory address and control signals, based on the device select signals, in order to disable memory devices when they are not being accessed. FIG. 2 schematically illustrates an example of such a system 20 which isolates unused subsystems of a plurality of subsystems 16, 18 using device select signals 22, 24 (e.g., chip select signals). The devices are disabled by not activating (asserting) the address, control, and/or device select signals, thus logically isolating the memory devices which are not accessed. This arrangement generally requires a device select signal for each physical memory rank and the address and device. select signals are generally controllable based on whether the corresponding memory device or group of memory devices is being accessed. Generating controllable address and device select signals can introduce timing delays on the device select, address, and control paths. In addition, this arrangement does not address the power dissipation and may degrade performance degradation by, for example, requiring that secondary control signals be generated for the memory devices.

SUMMARY

Certain embodiments described herein include a memory module comprising a printed circuit board comprising at least one connector configured to be operatively coupled to a memory controller of a computer system. The memory module comprises a plurality of memory devices on the printed circuit board and a circuit. The circuit comprises a first set of ports comprising a plurality of bi-directional ports, each port of the first set of ports operatively coupled to at least one memory device of the plurality of memory devices. The memory module further comprises a second set of ports comprising one or more bi-directional ports, each port of the second set of ports operatively coupled to the at least one connector. The memory module of certain embodiments comprises a switching circuit configured to selectively operatively couple one or more ports of the second set of ports to one or more ports of the first set of ports. The one or more ports of the first set of ports and the one or more ports of the second set of ports each comprise a correction circuit in certain embodiments. The correction circuit reduces noise in one or more signals transmitted between the one or more ports of the first set of ports and the one or more ports of the second set of ports.

A method of using a memory module with a computer system is described in certain embodiments. The method includes providing a memory module comprising a printed circuit board having at least one connector configured to be operatively coupled to a memory controller of a computer system and to a plurality of memory devices. The 'memory module further including a circuit which comprises a first set of ports comprising a plurality of bi-directional ports, each port of the first set of ports operatively coupled to at least one memory device of the plurality of memory devices. The circuit further comprises a second set of ports comprising one or more bi-directional ports. Each port of the second set of ports is operatively coupled to the at least one connector. The circuit is configured to selectively operatively couple one or more ports of the second set of ports to one or more ports of the first set of ports in some embodiments. The one or more ports of the first set of ports and the one or more ports of the second set of ports each comprise a correction circuit. The correction circuit reduces noise in one or more signals transmitted between the one or more ports of the first set of ports and the one or more ports of the second set of ports. The method includes activating the circuit to selectively operatively couple at least one of the one or more ports of the second set of ports to at least one of the one or more ports of the first set of ports. The method also includes activating the circuit to reduce noise in the one or more signals.

Certain embodiments are described herein provide a circuit comprising a first set of ports comprising a plurality of bi-directional ports. Each port of the first set of ports may be configured to be operatively coupled to at least one memory device of a plurality of memory devices on a printed circuit board. The circuit further comprises a second set of ports comprising one or more bi-directional ports, each port of the second set of ports configured to be operatively coupled to at least one connector on the printed circuit board.

The at least one connector is configured to be operatively coupled to a memory controller of a computer system. The circuit further comprises a switching sub-circuit configured to selectively operatively couple one or more ports of the second set of ports to one or more ports of the first set of ports. The one or more ports of the first set of ports and the one or more ports of the second set of ports each comprise a correction circuit in certain embodiments. The correction circuit can reduce noise in one or more signals transmitted between the one or more ports of the first set of ports and the one or more ports of the second set of ports.

In certain embodiments, a circuit comprises a first set of ports comprising a plurality of bi-directional ports. Each port of the first set of ports can be configured to be operatively coupled to at least one subsystem of a plurality of subsystems. The circuit may comprise a second set of ports comprising one or more bi-directional ports, each port of the second set of ports configured to be operatively coupled to at least one subsystem of one or more subsystems. In certain embodiments, the circuit comprises a switching sub-circuit configured to selectively operatively couple one or more ports of the second set of ports to one or more ports of the first set of ports. The one or more ports of the first set of ports and the one or more ports of the second set of ports each comprise a correction circuit in certain embodiments. The correction circuit can reduces noise in one or more signals transmitted between the one or more ports of the first set of ports and the one or more ports of the second set of ports.

DETAILED DESCRIPTION

Electronic systems incorporating devices and methods in accordance with embodiments described herein may include memory subsystems that contain multiple memory boards or modules that are driven by a single memory controller which synchronizes memory access and manages memory coherency. However, having a single memory controller may gradually degrade system performance and increase power consumption as the physical and the logical size of the memory subsystem increases. Increases in memory speed may further increase the power consumption. Additionally, impedance mismatches between the system board, the memory boards, and the memory devices may also substantially degrade the performance and power efficiency of traditional memory systems. Such memory systems may be used with a power supply which helps to stabilize the voltage level, and/or a thermo-mechanical component to moderate memory subsystem temperature, and/or software for throttling the processor to lower the memory access rate.

Embodiments described herein address these speed and power issues in memory systems. For example, a circuit of certain embodiments can comprise an isolation switch and can logically isolate inactive subsystems and reduce signal reflection and/or other noise at, for example, the interface between the system board and the memory board and at the interface between the memory board and the memory devices.

Certain embodiments described herein present a circuit for isolating inactive subsystems and maintaining and improving signal integrity in a variety of systems. Certain embodiments described herein are used to increase the performance of electronic systems without increasing the power dissipation or the memory access time. In certain embodiments, a plurality of circuits are configured so as to improve the interconnection (e.g., timing, power consumption, and/or signal integrity) between each of the plurality of circuits and a plurality of corresponding devices (e.g., memory devices) of a system or subsystem (e.g., a memory module of a computer system). For example, the data width of each of the plurality of circuits may be selected to optimize the interconnection (e.g., timing, power consumption, and/or signal integrity). In various embodiments, the data width of each of the plurality of devices may be 4, 8, or 16 bits, for example.

Certain embodiments described herein describe a circuit for use in high performance electronic systems which may contain transmission lines and relatively heavy fan-outs. A circuit is described herein which, in certain embodiments, includes at least some of the following components: a signal router, a programmable coarse impedance matching circuit, a self-adjusting damper circuit, a filter and/or a repeater/amplifier.

Figure 1:
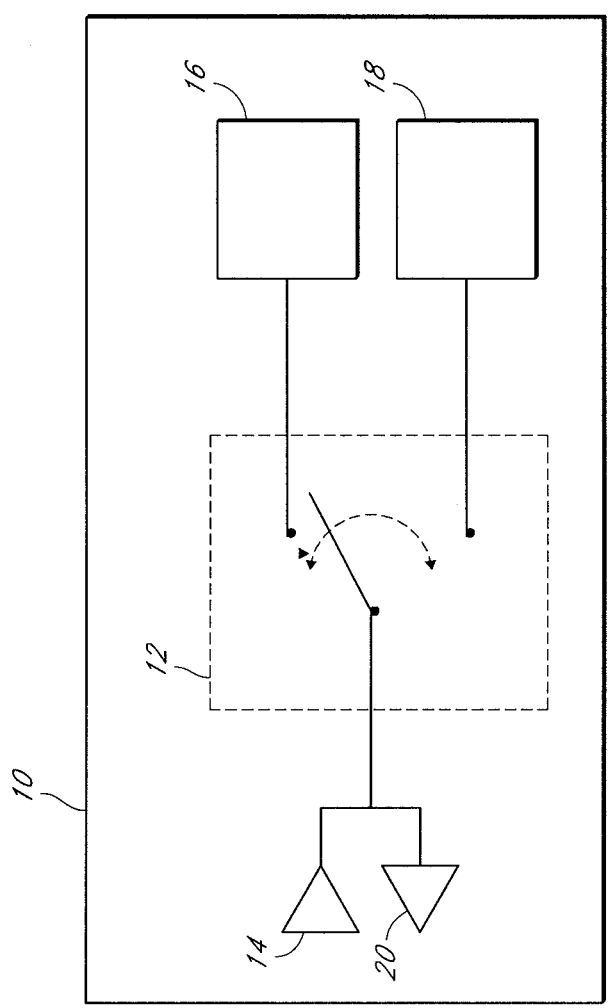
FIG. 1 schematically illustrates an example system which isolates unused subsystems and incorporates a multiplexer-demultiplexer.
Figure 2:
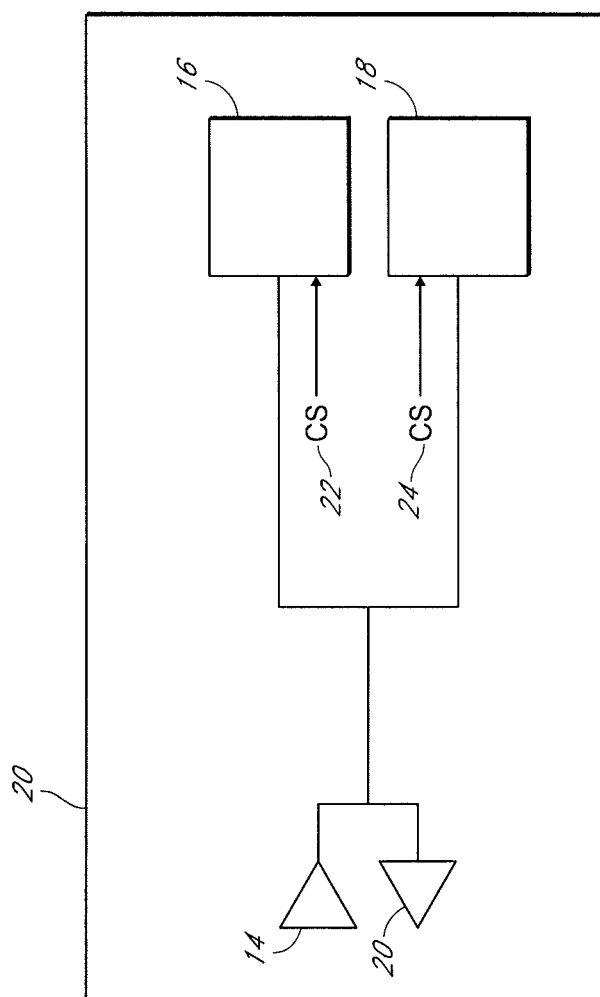
FIG. 2 schematically illustrates an example system which isolates unused subsystems using device select signals.
Figure 3:
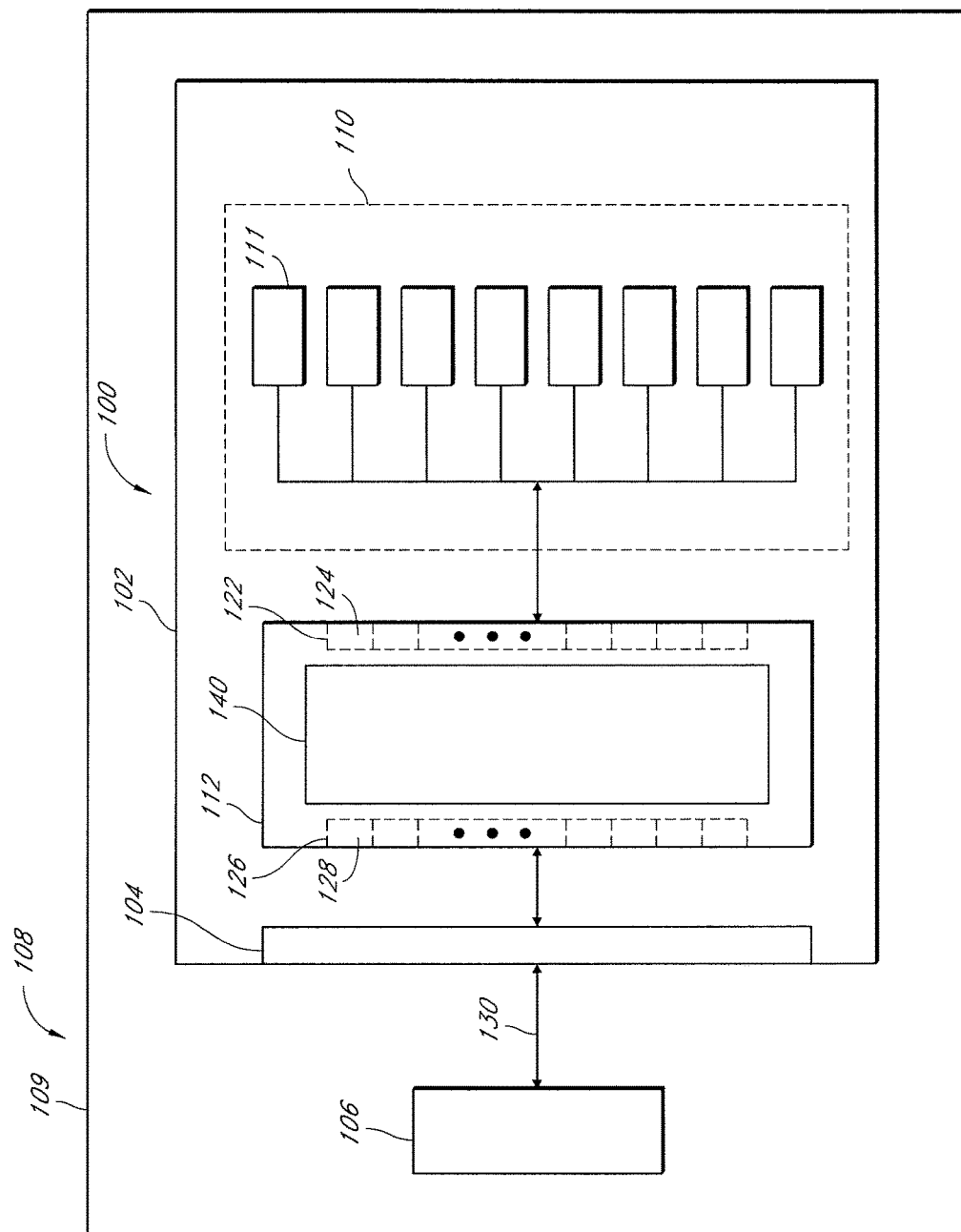
FIG. 3 schematically illustrates an example memory system incorporating a memory module in accordance with certain embodiments described herein.

FIG. 3 schematically illustrates an example system incorporating a memory module 100 in accordance with certain embodiments described herein. The memory module 100 comprises a printed circuit board (PCB) 102. The PCB 102 includes at least one connector 104 configured to be operatively coupled to a memory controller 106 of a computer system 108. The memory module 100 includes a plurality of memory devices 110 on the PCB 102.

The memory module 100 of certain embodiments further includes a circuit 112 comprising a first set of ports 122 comprising a plurality of bi-directional ports 124, each port 124 of the first set of ports 122 operatively coupled to at least one memory device 110 of the plurality of memory devices 110. The circuit 112 further comprises a second set of ports 126 comprising one or more bi-directional ports 128, each port 128 of the second set of ports 126 operatively coupled to the at least one connector 104. The circuit 112 further comprises a switching sub-circuit 140 configured to selectively operatively couple one or more ports 128 of the second set of ports 126 to one or more ports 124 of the first set of ports 122. The one or more ports 124 of the first set of ports 122 and the one or more ports 128 of the second set of ports 126 each comprises a correction circuit 150 (see, e.g., FIG. 4) which reduces noise in one or more signals transmitted between the one or more ports 124 of the first set of ports 122 and the one or more ports 128 of the second set of ports 126.

In certain embodiments, the memory module 100 has a memory capacity of 512-MB, 1-GB, 2-GB, 4-GB, 8-GB, or higher or lower. Other memory capacities are also compatible with certain embodiments described herein. In addition, memory modules 100 having widths of 4 bits, 8 bits, 16 bits, 32 bits, as well as other widths (in bytes or in bits), are compatible with embodiments described herein. In certain embodiments, the PCB 102 has an industry-standard form factor. For example, the PCB 102 can have a low profile (LP) form factor with a height of 30 millimeters and a width of 133.35 millimeters. In certain other embodiments, the PCB 102 has a very high profile (VHP) form factor with a height of 50 millimeters or more. In certain other embodiments, the PCB 102 has a very low profile (VLP) form factor with a height of 18.3 millimeters. Other form factors including, but not limited to, small-outline (SO-DIMM), unbuffered (UDIMM), registered (RDIMM), fully-buffered (FB-DIMM), mini-DIMM, mini-RDIMM, VLP mini-DIMM, micro-DIMM, and SRAM DIMM are also compatible with certain embodiments described herein. For example, in other embodiments, certain non-DIMM form factors are possible such as, for example, single inline memory module (SIMM), multi-media card (MMC), and small computer system interface (SCSI).

In certain embodiments, the plurality of memory devices 110 of the memory module 100 may be arranged as one or more ranks, each rank of memory generally having a bit width. In certain embodiments, each rank may comprise an independent set of memory devices 111 of the plurality of memory devices 110 that can be accessed by the memory controller 106 to access the full bit-width of the memory bus of the memory module 100. For example, a memory module 100 in which each rank of the memory module is 64 bits wide is described as having an "x 64" organization. Similarly, a memory module 100 having 72-bit-wide ranks is described as having an "x 72" organization. The number of memory devices 111 of a memory module 100 can be increased by increasing the number of memory devices 111 per rank or by increasing the number of ranks of the memory module 100. For example, a memory module with four ranks with each rank having N 512-MB memory devices 111 has double the memory capacity of a memory module with two ranks with each rank having N 512-MB memory devices 111 and four times the memory capacity of a memory module with one rank with each rank having N 512-MB memory devices.

During operation, one or more ranks of a memory module 100 may be selected or activated from the plurality of ranks by control signals that are received from a component of the system (e.g., a system memory controller 106 or a local memory controller of the memory module 100). Examples of such control signals include, but are not limited to, rank-select signals, also called chip-select signals. In certain other embodiments, the memory module 100 comprises only one rank of memory devices 111.

As discussed, the PCB 102 includes at least one connector 104 configured to be operatively coupled to a memory controller 106 of a computer system 108, such as a host computer system 108. For example, the connector 104 is electrically coupled, logically coupled, or both, with the memory controller 106 in some other manner. In certain embodiments, the connector 104 comprises a wireless radio frequency (RF) interface or a portion thereof and is wirelessly connected (e.g., via one or more RF antennas) to the memory controller 106. In some embodiments, some other connection mechanism is used besides the connector 104. Examples of host computer systems 108 include, but are not limited to, blade servers, 1U servers, personal computers (PCs), data storage systems and other applications in which space is constrained or limited. The memory controller 106 may comprise a disk controller of the computer system 108, for example. The memory controller 106 of certain embodiments may be mounted on a system board 109 of the host computer 108. The connector 104 can comprise a plurality of edge connections distributed along one or more edges of the PCB 102, which fit into a corresponding slot connector of the host system. The connector 104 of certain embodiments provides a conduit for power voltage as well as data, address, and control signals between the memory module 100 and the host system 108. For example, the connector 104 can comprise a standard 240-pin DDR2 edge connector. Additionally, in certain embodiments, more than one memory module 100 is coupled to the host system 108.

The plurality of memory devices 110 on the PCB 102 may include one or more volatile memory components. For example, the plurality of memory devices 110 of certain embodiments comprises two or more dynamic random-access memory (DRAM) elements Ill. For example, in the block diagram of FIG. 3, the plurality of memory devices 110 comprises eight DRAM devices Ill. Types of DRAM devices 111 compatible with certain embodiments described herein include, but are not limited to, DDR, DDR2, DDR3, and synchronous DRAM (SDRAM). The memory devices 111 may comprise other types of memory elements such as static random-access memory (SRAM). In addition, volatile memory devices 111 having bit widths of 4, 8, 16, 32, as well as other bit widths, are compatible with certain embodiments described herein. Memory devices 111 compatible with certain embodiments described herein have packaging which include, but are not limited to, thin small-outline package (TSOP), ball-grid-array (BGA), fine-pitch BGA (FBGA), micro, BGA (μBGA), mini-BGA (mBGA), and chip-scale packaging (CSP).

The first set of ports 122 of the circuit 112 comprises a plurality of bidirectional ports 124 where each port of the first set of ports 122 is operatively coupled to at least one memory device 111 of the plurality of memory devices 110. In addition, the second set of ports 126 of the connector 104 comprises one or more bi-directional ports 128 where each port of the second set of ports 126 is operatively coupled to the at least one connector 104. The switching sub-circuit 140 is configured to selectively operatively couple one or more ports 128 of the second set of ports 126 to one or more ports 124 of the first set of ports 122. The operative coupling of the first set of ports 122 to the memory devices 110, the second set of ports 126 to the connector 104, and the selective operative coupling between the first and second set of ports 122, 126 may comprise electrical coupling, logical coupling, or both. In other embodiments, optical coupling or some other manner of coupling may be employed.

In certain embodiments, each bi-directional port 128 of the second set of ports 126 may correspond to a signal of a memory bus 130 which operatively couples the memory controller 106 and the memory module 100 via the connector 104. For example, the memory controller 106 may generally read data from and/or write data to the plurality of memory devices 110 on the memory module 100 through the memory bus 130 and through the bi-directional ports 124, 128. In certain embodiments, the number of bi-directional ports 128 of the second set of ports 126 may correspond to the number of data bits in the memory bus 130 (i.e., the bit-width of the memory bus 130).

In certain embodiments, each of the bi-directional ports 124 in the first set of ports 122 may correspond to and be operatively coupled to a signal port of one of the memory devices 111 of the plurality of memory devices 110. The bi-directional ports 124 correspond to the data signal ports, for example, of the plurality of memory devices 110. Because each memory device 111 includes associated data signal ports, the number of bidirectional ports 124 in the first set of ports of certain embodiments may be larger than the number of bi-directional ports 128 in the second set of ports 122 (e.g., the number of bits in the memory bus 130). In general, the overall number of ports of the plurality of memory devices 110 and corresponding bi-directional ports 124 in the first set of ports 126 may depend on the organization of the memory module. For example, the number of ports may depend on the number of memory devices and/or the number of ranks in the memory module. In certain embodiments, the memory module 100 includes a plurality of circuits 112. The circuits 112 may be configured so as to improve the interconnection (e.g., timing, power consumption, and/or signal integrity) between each of the plurality of circuits 112 and a plurality of corresponding memory devices 111 of memory module 100. For example, the data width of each of the plurality of circuits 112 may be selected to optimize the interconnection (e.g., timing, power consumption, and/or signal integrity). In various embodiments, the data width of each of the plurality of devices may be 4, 8, or 16 bits, for example. Other data widths are possible in other embodiments. In some embodiments, the data width of each circuit 112 corresponds to the data width of each of the memory devices 111 such that each circuit 112 is operatively coupled to one of the plurality of memory devices 110. In other embodiments, the data width of each circuit 112 corresponds to a multiple of the data width of each memory device 111 such that each circuit 112 may be operatively coupled to the data bits of more than one memory device 111. In various embodiments, the data width of each circuit 112 corresponds to a segment of the data width of each memory device 111 or to segments of multiple memory devices 111. As such, in some embodiments, each circuit 112 may be operatively coupled to a segment of the data bits of one memory device 111 or to segments of more than one memory device 111. Other configurations are possible which optimize the interconnection (e.g., timing, power consumption, and/or signal integrity). In addition, in certain embodiments, the location of each of the plurality of circuits 112 on the PCB 102 is selected to optimize the interconnection, timing, power consumption, and signal integrity.

In other embodiments, the bi-directional ports 124 correspond to one or more other bits of the memory bus 130 instead of, or in addition to, the data bits. For example, one or more of the ports 124 may correspond to address, chip select, control (e.g., read/write) signals. Moreover, in some embodiments, one or more ports of the first set of ports 122 is not bi-directional. For example, in one embodiment, signals corresponding to address, chip select and/or control signals from the first set of ports 122 to the plurality of memory devices 110 and not vice versa. For example, one or more of the address, chip select, and control signals may be used to control the routing of the bi-directional ports 124 which correspond to data bits.

As discussed, the switching sub-circuit 140 is configured to selectively operatively couple one or more ports of the second set of ports 126 to one or more ports of the first set of ports 122. In certain embodiments, the switching sub-circuit 112 may be capable of interconnecting any number of the second set of ports 126 to any number of the first set of ports 122 simultaneously. In certain embodiments, the switching sub-circuit 140 can pass signals (e.g., information such as the data signals described above) from one port 128 of the second set of ports 126 to an operatively coupled port 124 of the first set of ports 122 and vice versa. Additionally, the switching sub-circuit 140 of some embodiments can pass signals from one port 128 of the second set of ports 126 to multiple operatively coupled ports 124 of the first set of ports 122 and vice versa. In certain embodiments, the switching sub-circuit 140 isolates and provides a known static value to all un-driven ports, thereby reducing any dynamic power consumption associated with floating or toggling electrical nodes.

The switching sub-circuit 140 of certain embodiments can function as an isolation switch which isolates and/or inactivates individual subsystems not actively transferring information. For example, in an example embodiment, the plurality of memory devices 110 comprises multiple independently accessible ranks. When the memory controller accesses one of the ranks of the memory module 100, the switching sub-circuit 140 isolates and/or inactivates at least the one or more other, un-accessed ranks. For example, the switching sub-circuit 140 does not operatively couple ports from the second of set of ports 126 to the first set of ports 122 which are coupled to the memory devices 111 of the unaccessed one or more ranks of memory devices 110. In certain embodiments, the switching sub-circuit 140 may function as or be characterized as a scalable isolation switch router which routes the information from one subsystem to another (e.g., host computer 108 to the memory module 100 via the memory controller 106), establishing a one-to-one connection for transferring data from point-to-point, and/or establishing a one-to-many connection for broadcasting data. The switching sub-circuit 140 comprises or is characterized as a bidirectional multiplexer-demultiplexer in certain embodiments. In other embodiments, the switching sub-circuit 140 comprises or is characterized as a router.

In certain embodiments, the memory module 100 further includes circuitry (not shown) for controlling the operation of the circuit 112 and the components therein (e.g., the switching sub-circuit 140 and the correction circuit 150, as described more fully below). For example, in one embodiment, the memory module 100 comprises a local memory controller which is operatively coupled to one or more control inputs (not shown) of the circuit 112 to control the selective coupling of the second set of ports 126 to the first set of ports 122. In certain other embodiments, some other component of the memory module 100 controls the operation of the circuit 112 or the circuit 112 comprises internal control circuitry. In various embodiments, the circuitry for controlling the circuit 112 includes discrete logic, one or more microprocessors, a field-programmable gate array (FPGA), or a computer programmable logic device (CPLD). In yet other configurations, an external component controls the operation of the circuit 112.

The circuit 112 of certain embodiments comprises one physically integral component (e.g., one integrated circuit package mounted on the memory module 100).
Various alternative configurations for the physical organization of the circuit 112 are possible, however. In certain other embodiments, the circuit 112 comprises multiple, physically separate components. For example, in one embodiment, the circuit 112 comprises one physically separate component per memory device 111 (e.g., integrate circuit packages mounted on the memory module 100). In another embodiment~ the circuit 112 comprises one physically separate component per memory rank. In some embodiments, the circuit 112 comprises one physically separate component corresponding to multiple memory devices 111.

Figure 4:
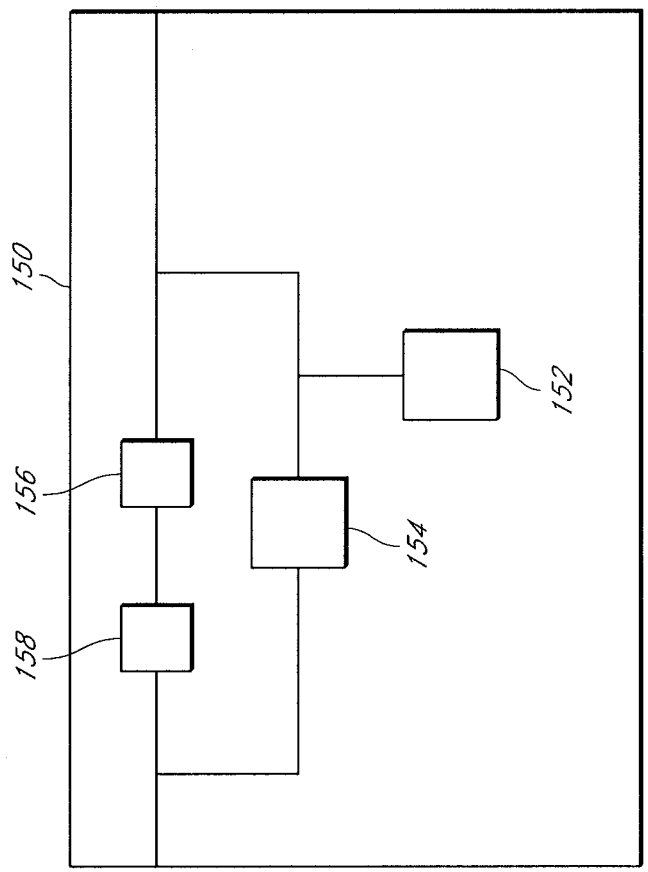
FIG. 4 schematically illustrates an example correction circuit In accordance with certain embodiments described herein.

FIG. 4 schematically illustrates an example correction circuit 150 in accordance with certain embodiments described herein. As shown, in certain embodiments, the correction circuit 150 comprises one or more correction elements (e.g., at least one coarse correction element 152 to provide coarse correction of the noise and at least one fine correction fine correction element 154 to provide fine correction of the noise). The correction circuit 150 of certain embodiments further comprises at least one filter element 156. In certain embodiments, the correction circuit 150 further comprises at least one repeater/amplifier element 158, which improves the signal quality of the one or more signals.

Referring to FIGS. 3 and 4, the correction circuit 150 reduces noise in one or more signals transmitted between the one or more ports of the first set of ports 122 and the one or more ports of the second set of ports 126. For example, the correction circuit 150 may reduce noise due to impedance mismatches (e.g., due to discontinuity regions) at nodes between the memory controller 106 and the plurality of memory devices 110. In certain embodiments, the noise may comprise signal reflections. For example, in certain embodiments, the signal paths between the host computer 108 and the plurality of memory devices 110 or portions thereof may be characterized as transmission lines if they are greater than or about equal to a particular fraction of the wavelength of the signal, such as, for example, greater than or equal to about ¼ of the wavelength of the signal. In other configurations, the signal paths may be characterized as transmission lines when the signal path is greater than or equal to some other fraction of the wavelength of the signal such as, for example, ½, ⅛, or 1/10 of the wavelength. In certain embodiments, the system (e.g., memory module 100) incorporating the circuit 112 has signal delays which are related to signal characteristics such as the signal transition rate and/or the rise/fall time of the signals. For example, the system incorporating the circuit 112 may include signal delays which are more than some fraction (e.g., ½) of the signal transition rate and/or the rise/fall time of the signals. In other embodiments, the signal delays are related in some other way to the signal transition rate and/or the rise/fall time of the signals (e.g., are more than ¼, ⅛ of those values) or are related to some other signal property.

The reflections may be caused by one or more discontinuity regions along the signal paths. For example, discontinuity regions comprise points or regions at which the characteristic impedance of the corresponding signal path changes. For example, the interface between the system board 109 of the host computer 108 and the memory module 100 (e.g., the connector 104) may comprise a discontinuity region along each of the signal paths. The interfaces between the connector 104 of the memory module 100 and each of the memory devices 111 mounted on the PCB 102 may comprise one or more discontinuity regions along each of the signal paths.

The noise may comprise cross-coupling between the signal paths in certain embodiments. For example, a cross-coupling impedance may be present between one or more of the signal paths or portions thereof. In certain embodiments, the cross-coupling impedance may include cross-coupling due to cross-coupling capacitance, inductance (e.g., mutual inductance), transconductance, or a combination thereof. Additionally, a variety of other noise are possible such as, for example, electromagnetic interference or other types of noise.

Figure 5:
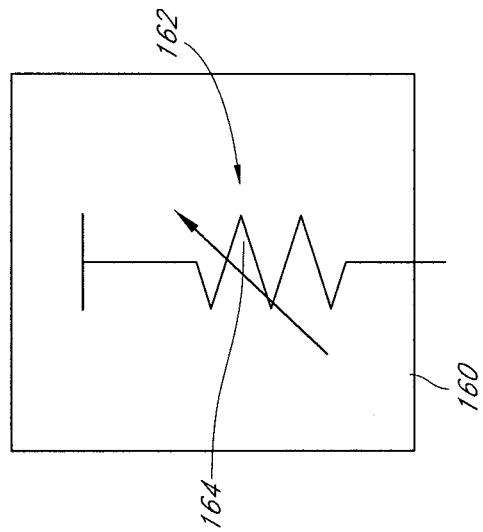
FIG. 5 schematically illustrates an example programmable impedance matching circuit in accordance with certain embodiments described herein.

Referring to FIG. 4, in certain embodiments, the correction circuit 150 includes one or more elements to provide for coarse correction of signal noise due to impedance mismatches (e.g., discontinuity regions) in the system. The at least one coarse correction element 152 comprises at least one programmable impedance matching circuit in certain embodiments. FIG. 5 schematically illustrates an example programmable impedance matching circuit 160 in accordance with certain embodiments described herein. For example, the programmable impedance matching circuit 160 may comprises at least one programmable resistor 162. The resistance of the programmable resistor 162 may be controllable by a control signal 164. In certain embodiments, the coarse correction element 152 may be integrated with the switching sub-circuit 140, the fine correction element 154, the filter element 156, and/or the repeater/amplifier element 158. Alternatively, in other embodiments, the coarse correction element 152 may be implemented with discrete components.

In other embodiments, the coarse correction element 152 comprises a network of resistors 162 which can be configured to provide programmable impedance matching. In some embodiments, the coarse correction element 152 may comprise a set of programmable coarse impedance matching circuits 160 that are connected to each of the ports 124, 128 of the first set of ports 122 and the ports 128 of the second set of ports 126. Advantageously, the impedance values of the coarse correction element 152 may be dynamically controllable, configurable, and/or programmable, so as to match the characteristic impedances of the transmission lines (e.g., signal paths) in the system. The values of these impedances may differ (e.g., may be programmed differently) based on which particular signal path is activated (e.g., by the switching sub-circuit 140). Where the coarse correction element 152 comprises at least one impedance matching circuit, the granularities of the configurable impedance values may be configured based on the application of the particular system. In some embodiments, the impedance matching circuit of the coarse correction element 152 may include a real time controllable impedance control input for preprogramming and/or dynamically controlling the impedance matching circuit. In this manner, the impedance matching circuit 152 may, in certain embodiments, provide dynamically controllable variable impedance which can be pre-set for matching the impedance of the subsystem that drives the circuit 112.

In certain embodiments, the at least one fine correction element 154 of the correction circuit 150 further reduces signal reflections due to impedance mismatches and/or reduces other noise. In certain embodiments, for example, the coarse correction element 152 may be characterized as a first refining stage and the fine correction element 154 may be referred to as a second refining stage. The fine correction element 154 may smooth out the signal after it has undergone coarse correction (e.g., impedance matching) and reduces or removes transmission line characteristics from the received signal. Referring again to FIG. 4, the fine correction element 154 can be connected, for example, in parallel with the programmable coarse correction element 152. In some embodiments, the fine correction element 154 operates to reduce the impedance mismatches by introducing a current source that damps to the slew rate of the input signal, reducing signal reflection. The fine correction element 154 actively counteracts the noise in certain embodiments. In addition, the fine correction element 154 of certain embodiments is dynamically responsive to one or more changes in the noise, such as, for example, changes in the frequency of the noise component.

Figure 6:
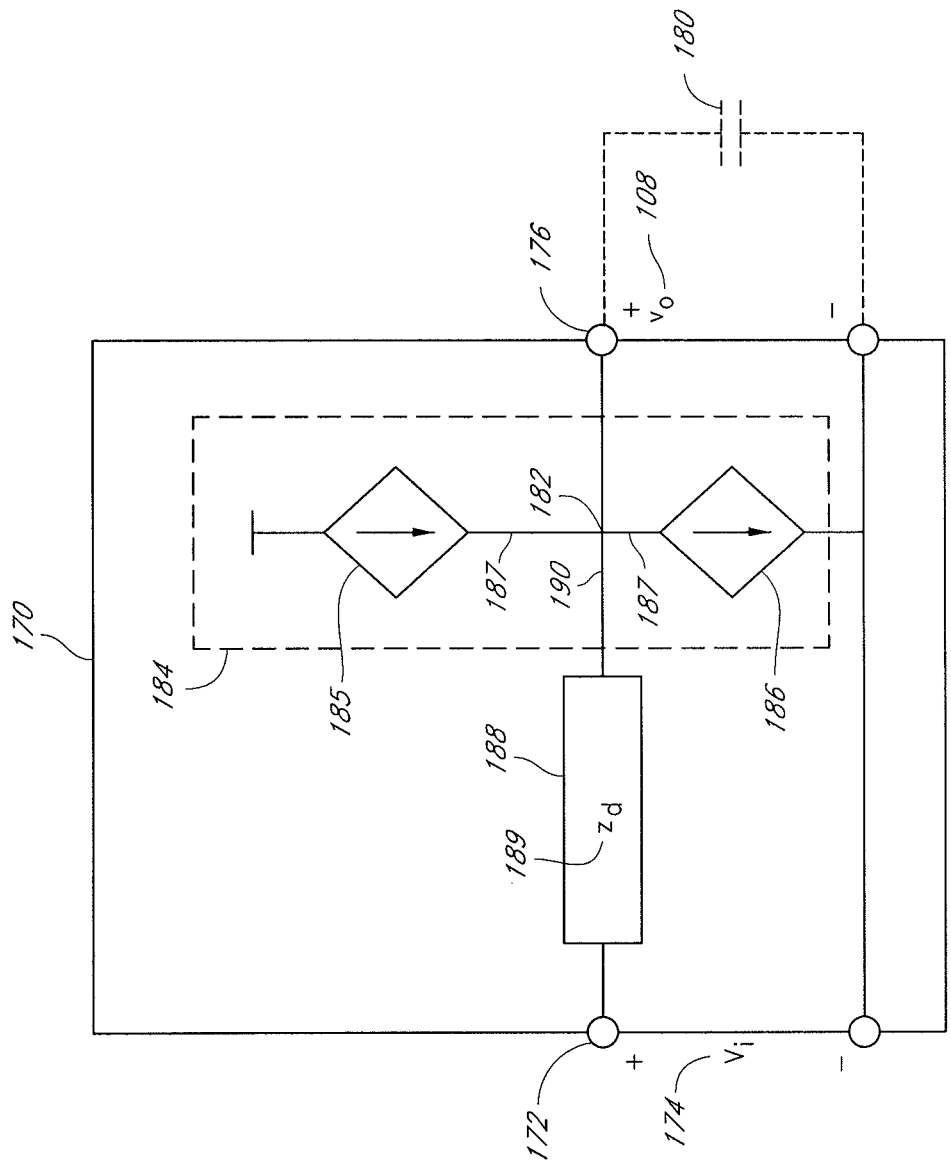
FIG. 6 schematically illustrates an example self-adjusting damper circuit in accordance with certain embodiments described herein.

The fine correction element 154 may include at least one damper circuit. The damper circuit includes at least one self-adjusting damper circuit 170 in certain embodiments, such as the example self-adjusting damper circuit 170 schematically illustrated by FIG. 6. In certain embodiments, the self-adjusting damper circuit 170 comprises an input terminal 172 adapted to receive an input signal 174 comprising an input noise component and an input signal component. The damper circuit 170 further comprises an output terminal 176. In certain embodiments, the damper circuit 170 includes a first sub-circuit 184 adapted to generate a first signal 187 responsive to at least a portion of the noise component. For example, the first sub-circuit 184 may generate the first signal 187 in response to the portion of the noise component not reduced by the coarse correction element 152 in certain embodiments. The damper circuit 170 of certain embodiments further comprises a second sub-circuit 188 adapted to generate a second signal 190 corresponding to a delayed version of at least a portion of the input signal. The damper circuit 170 combines the first signal 187 with the second signal 190 to generate an output signal 108 on the output terminal 176 wherein the output signal comprises an output noise component smaller than the input noise component. For example, the first signal 187 and the second signal 190 may be combined at the node 182 of the damper circuit 170. The output signal 176 of certain embodiments is substantially representative of the signal component of the input signal 174. The first subcircuit 184 of certain embodiments comprises one or more current sources 185, 186. For example, the current sources 185, 186 may each comprise a controlled current source such as a voltage-controlled current source 185, 186 in certain embodiments. In some embodiments, the first sub-circuit 184 may comprise or be characterized as a negative feedback current source. In various embodiments, the self-adjusting damper circuit 170 includes an enable control input (not shown) for enabling the self-adjusting damper circuit 170. Examples of self-adjusting damper circuits 170 in accordance with certain embodiments described herein are described in U.S. Provisional Application No. 61/044,825, filed Apr. 14, 2008, and copending U.S. application Ser. No. 12/422,912, filed by the assignee of the present application on Apr. 13, 2009. Both applications are incorporated in their entirety by reference herein.

In certain embodiments, the at least one filter element 156 and the at least one repeater/amplifier element 158 may also reduce noise from other sources such as, for example, signal coupling (e.g., cross-coupling). The filter element 156 may reduce noise from the one or more signals where the noise includes a predetermined range of frequencies. For example, the filter element 156 may include at least one band-pass filter and may reduce any low and/or high frequency noise components. In other embodiments, the filter element 156 comprises at least one other type of a filter such as a notch filter, a low-pass filter, or a high-pass filter.

Figure 7:
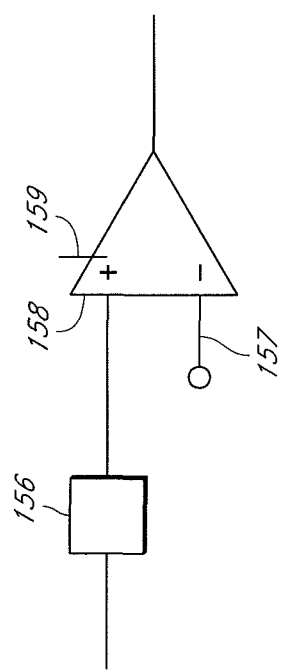
FIG. 7 schematically illustrates example configuration including an example filter element connected to an example repeater/amplifier in accordance with certain embodiments described herein.

One or more of the filter element 156 and the repeater/amplifier element 158 of certain embodiments enhance signal slew rate to reduce the transient power dissipation at target devices or components (e.g., one or more of the memory devices 110). FIG. 7 schematically illustrates example configuration including an example filter element 156 connected to an example repeater/amplifier element 158 in accordance with certain embodiments described herein. The repeater/amplifier element 158 includes an output enable control input 159 for controlling the bi-directional signal path. In various embodiments one or more of the filter element 156 and repeater/amplifier element 158 are programmable and/or dynamically controllable. The repeater/amplifier element may further include a reference input 157. In certain embodiments, the repeater/amplifier element 158 may include one or more operational amplifiers, for example. Referring again to FIG. 4, in certain embodiments, only filter element 156, only the repeater, only the amplifier, or any combination of the three elements may be included in the circuit.

The filter element 156 and/or the repeater/amplifier element 158 of certain embodiments provide wave reshaping functions and generally reduces signal noise. For example, the filter element 156 and/or the repeater/amplifier element 158 may reduce signal ringing due to reflection (e.g., reflections at one or more interfaces along the signal paths such as interfaces between the circuit 112, the connector 104, the memory devices 110 and/or the system board 109 of FIG. 3). In certain embodiments, the repeater/amplifier element 158 reshapes the signal, which may be deteriorated due to transmission over lossy transmission lines having discontinuity regions. The repeater/amplifier element 158 may be configured to repeat the input signal, generating an output signal with earlier transition trigger points and faster slew rates in order to regain speed and to reduce the transient power.

In certain embodiments, the circuit 112 or portions thereof (e.g., the switching sub-circuit 140, the correction circuit 150 or elements thereof, etc.) is selected from a group consisting of: a programmable-logic device (PLD), an application-specific integrated circuit (ASIC), a field-programmable gate array (FPGA), a custom-designed semiconductor device, and a complex programmable-logic device (CPLD). For example, in certain embodiments, the circuit 112 or portions of thereof is implemented in one or more of a PLD, ASIC, FPGA, or CPLD. In other embodiments, the circuit 112 or portions thereof is implemented using some other technology, such as, for example, using discrete components.

In various embodiments, the elements of the circuit 112 such as the switching sub-circuit 140, the coarse correction element 152, the fine correction element 154, the filter element 156, and the repeater/amplifier element 158, comprise or may characterized as independent, fully controllable functional blocks. Additionally, in certain embodiments, any subset of one or more of these functional blocks may be implemented in order to enhance performance, reduce power dissipation, or provide other advantages.

Figure 8:
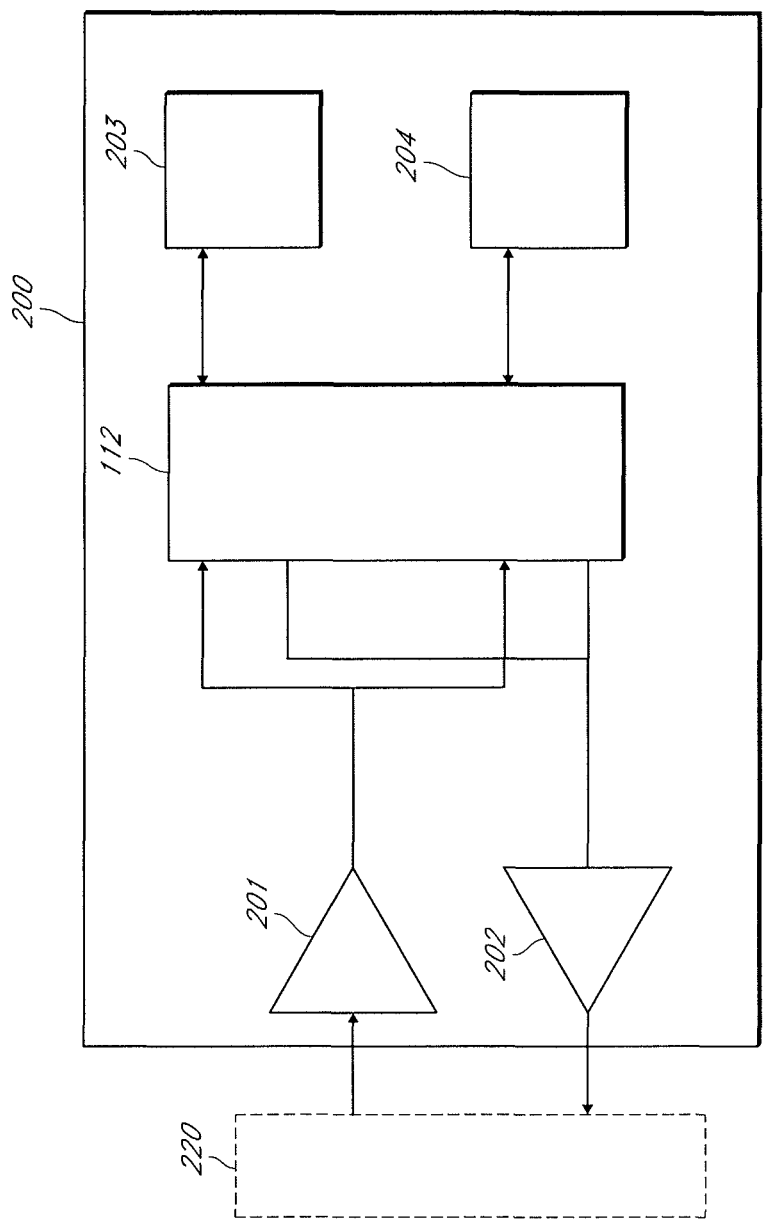
FIG. 8 schematically illustrates an example system having an example circuit connecting the system with one or more other systems in accordance with certain embodiments described herein.

FIG. 8 schematically illustrates an example system 200 having an example circuit 112 connecting a system 200 with one or more other systems 220 in accordance with certain embodiments described herein. The circuit 112 may be any of the circuits 112 discussed herein, such as the circuit 112 discussed above with respect to FIG. 3, for example. The system 200 of FIG. 8 includes a driver 202, a receiver 201, and two subsystems 203, 204. For illustration purposes, the system 200 of FIG. 8 is described as an open system that communicates with other systems 220 via the driver 202 and the receiver 201. Furthermore, in some embodiments, a connector (not shown) connects the system 200 with other systems by means of transmission lines. For example, the system 200 may be a memory system and the receiver 201 and the driver 202 of FIG. 8 may represent memory signals (e.g., data, address and/or control signals) transmitted between the system 220 (e.g., a memory controller and the subsystems 203, 204 (e.g., two sets of independently addressable memory devices such as DRAM devices). In certain embodiments, for example, the circuit 112 may be disposed on a memory board that is populated with sets of memory devices 203, 204.

In various embodiments, the receiver 201 may or may not contain any active circuits. For example, the receiver 201 may be a connector such as a socket or DIMM interface with a system board (e.g., the connector 104 described above in regards to FIG. 3). The output signal from the receiver 201 may exhibit the characteristics of the signal on a transmission line such as, for example, wave dispersion, attenuation, and reflection. In certain embodiments, the output signal from the receiver 201 goes through a number of refining, filtering and/or amplification stages in circuit 112 as described herein to improve the performance of the overall system. For example, the signal quality is enhanced by introducing at least one circuit 112 including at least one correction circuit 150 comprising one or more coarse correction elements 152 (e.g., impedance matching circuits), fine correction elements 154 (e.g., self-adjusting dampers), filter elements 156 (e.g., bandpass filters) and/or repeater/amplifier elements 158 as described herein on the signal paths (e.g., from receiver 101 to subsystem 103). For example, the circuit 112 may reduce power consumption by selectively isolating the inactive (or un-accessed) subsystems and may enhance the access rate of a targeted subsystem. For example, in one embodiment, the system 200 comprises a memory module 100 such as one of the memory modules described herein, the subsystems 203 and 204 comprise memory devices such as the memory devices 111 described herein, and the other system 220 comprises a host computer 108 including a memory controller 106 as described herein.

In certain embodiments, the performance is enhanced and power dissipation is reduced by removing the load associated with other (e.g., unused or inactive) subsystems (e.g., the subsystem 204) and reshaping the signal waveform using a filter element 156 and/or the repeater/amplifier element 158. In some embodiments, there are two refining stages for reducing signal reflections due to impedance mismatches. In some embodiments, for example, the first refining stage is the coarse correction element 152 (e.g., an impedance matching circuit) that matches the impedance of the transmission line (e.g., wire) prior to a receiver 201 with the characteristic impedance of the transmission line (e.g., wire) in the system 100. The second stage may be the fine correction element 154 (e.g., a self adjusting damper for further reducing signal reflections due to impedance mismatches and/or reducing other noise.

Figure 9:
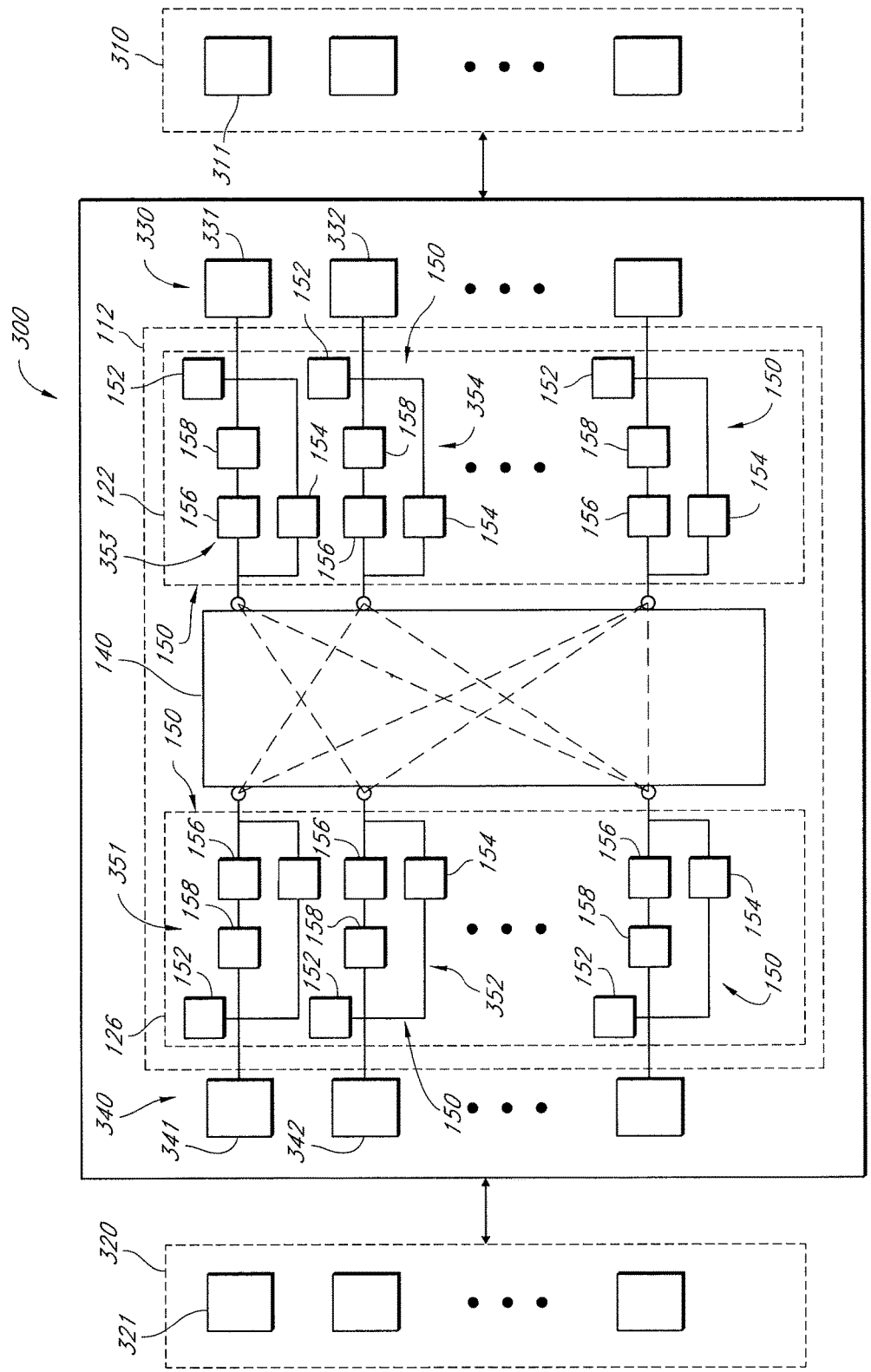
FIG. 9 schematically illustrates an example system including an example circuit in accordance with certain embodiments described herein.

FIG. 9 schematically illustrates an example system 300 including an example circuit 112 in accordance with certain embodiments described herein. The circuit 112 may be any of the circuits 112 discussed herein, such as the circuit 112 discussed above with respect to FIG. 3, for example. The circuit 112 comprises a first set of ports 122 comprising a plurality of bi-directional ports, each port of the first set of ports 122 configured to be operatively coupled to at least one subsystem 311 of a plurality of subsystems 310. The circuit 112 further comprises a second set of ports 126 comprising one or more bi-directional ports, each port of the second set of ports 126 configured to be operatively coupled to at least one subsystem 321 of one or more subsystems 320. In certain embodiments, the circuit 112 is configured to selectively operatively couple one or more ports of the second set of ports 126 to one or more ports of the first set of ports 122. In certain embodiments, the one or more ports of the first set of ports 122 and the one or more ports of the second set of ports 126 each comprises a correction circuit 150 which reduces noise in one or more signals transmitted between the one or more ports of the first set of ports 122 and the one or more ports of the second set of ports 126. The correction circuit 150 of certain embodiments may comprise one of the correction circuits 150 described herein such as the correction circuits 150 described above with respect to FIGS. 4-7 and may include/at least one coarse correction element 152, at least one fine correction element 154, at least one filter element 156, and at least one repeater/amplifier element 158, or any combination or sub-combination thereof. In other embodiments, the fine correction element 154 may be placed after the switching sub-circuit 140 in order to achieve better results. For example, the fine correction element 154 may be connected after the filter element 156 (e.g., between the filter 156 and the repeater/amplifier element 158) in certain embodiments.

In certain embodiments, the system 300 includes a first set of interfaces 330 positioned between (e.g., logically and/or physically between) and operatively coupled to the first set of ports 122 and to the plurality of subsystems 310. In addition, the system 300 of certain embodiments may include a second set of interfaces 340 positioned between (e.g., logically and/or physically between) and operatively coupled to the second set of ports 126 and the one or more subsystems 320. For example, the first and/or second sets of interfaces 330, 340 may comprise port connections.

In an example configuration, the plurality of subsystems 310 include a plurality of memory devices 311 (e.g., DRAM devices) mounted on a memory module and the first set of interfaces 330 comprise interfaces between the circuit 112 and the plurality of memory devices 311. For example, each of the first set of ports 122 may correspond to a memory signal (e.g., a data, address, and/or control signal) and each of the first set of interfaces 330 is operatively coupled to a corresponding memory signal port of a corresponding memory device 311. The one or more subsystems 320 of the example configuration comprise a host computer system and the second set of interfaces 340 comprises memory board (e.g., a PCB of a memory module) interfaces to the host system. For example, the second set of interfaces 340 form part of a connector. Each of the second set of ports 126 and corresponding interfaces of the second set of interfaces 340 corresponds to a memory signal (e.g., a data, address, and/or control signal) of at least one memory bus between the host system and the memory module.

The coarse correction elements 152 (e.g., impedance matching circuits) and the fine correction elements (e.g., self-adjusting dampers) of the second set of ports 126 of the example configuration are configured to reduce the signal reflection due to the impedance mismatching between the system board and the memory board. The coarse correction elements 152 (e.g., impedance matching circuits) and the fine correction elements (e.g., self-adjusting dampers) of the second set of ports 122 of the example configuration are configured to reduce the signal reflection due to the impedance mismatching between the circuit 112, the memory board and/or the plurality of memory devices. The filter elements 156 (e.g., a bandpass filter) reduce or filter out cross-coupling between signals, for example. For example, the filter elements 158 reduce or filter out cross-coupling between data, address, and/or control signals (e.g., wires).

Figure 10:
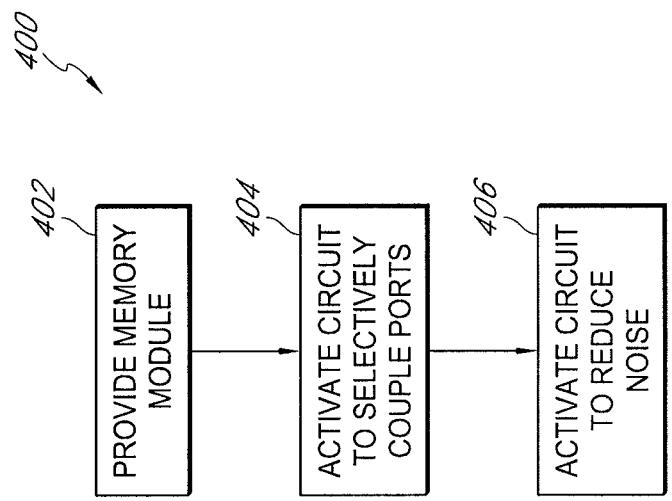
FIG. 10 is a flowchart of an example method 400 of using a memory module with a computer system in accordance with certain embodiments described herein.

FIG. 10 is a flowchart of an example method 400 of using a memory module 100 with a computer system in accordance with certain embodiments described herein. While the method 400 is described herein by reference to the memory module 100 schematically illustrated by FIG. 3, other memory modules, electronic systems or subsystems, and/or circuits are also compatible with the embodiments described herein. In certain embodiments, at operational block 402, the method 400 comprises providing a memory module 100 comprising a printed circuit board 102 having at least one connector 104 configured to be operatively coupled to a memory controller 106 of a computer system 108 and to a plurality of memory devices 110. The memory module 100 further comprises a circuit 112 including a first set of ports 122 comprising a plurality of bi-directional ports 124. In certain embodiments, each port 124 of the first set of ports 122 is operatively coupled to at least one memory device 111 of the plurality of memory devices 110. The circuit of certain embodiments further includes a second set of ports 126 comprising one or more bidirectional ports 128' where each port 128 of the second set of ports 126 is operatively coupled to the at least one connector 104.

The circuit 112 of certain embodiments is configured to selectively operatively couple one or more ports 128 of the second set of ports 126 to one or more ports 124 of the first set of ports 122. The one or more ports 124 of the first set of ports 122 and the one or more ports 128 of the second set of ports 126 each comprises at least one correction circuit 150 which reduces noise in one or more signals transmitted between the one or more ports 124 of the first set of ports 122 and the one or more ports 128 of the second set of ports 126.

The method 400 of certain embodiments further includes activating the circuit 112 at operational block 404 to selectively operatively couple at least one of the one or more ports 128 of the second set of ports 126 to at least one of the one or more ports 124 of the first set of ports 122. For example, in certain embodiments, activating the circuit 112 to perform the selective operative coupling may include sending the appropriate control signal or combination of control signals to a switching sub-circuit 140 of the circuit 112. In certain embodiments, the method 400 further includes activating the circuit 112 to reduce noise in the one or more signals at operational block 406. For example, in one embodiment, activating the circuit 112 to reduce noise comprises activating one or more of the elements of the correction circuit 150 (e.g., at least one coarse correction element 152, at least one fine correction element 154, at least one filter element 156, and at least one repeater/amplifier element 158) of ports 124, 128 of the first and second sets of ports 122, 126 corresponding to active signal paths between the memory controller 106 and the memory devices 110. Activating one or more of the elements 152, 154, 156, 158 of the correction circuit 150 may include sending control signals (e.g., enable signals) to the appropriate elements 152, 154, 156, 158 and/or receiving the control signals (e.g., enable signals) at the appropriate elements 152, 154, 156, 158.

The operational blocks 402, 404, 406 of the method 400 may be performed in a different order than provided or one or more of the operational blocks may be performed substantially at the same time or during overlapping time periods. For example, in certain embodiments, at least the operational block 404 and the operational block 406 are performed substantially simultaneously. In addition, in some embodiments, one or more of the operational blocks 402, 404, 406 may not be included, an additional operational block may be included, or both. The devices and methods described herein may be incorporated in any system (e.g. a board level system) or device that contains one or more connectors or wires.

Although certain preferred embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

What is claimed is:
1. A memory module operable to communicate data with a system memory controller via a memory bus in response to address and control signals from the system memory controller, comprising:
   a printed circuit board comprising at least one connector configured to be operatively coupled to the memory bus, the at least one connector including a plurality of edge connections distributed along one or more edges of the printed circuit board;

a plurality of memory devices on the printed circuit board, the plurality of memory devices being arranged in multiple ranks, each rank comprising an independent set of memory devices that can be accessed by the system memory controller to access a full bit-width of the memory bus;

at least one circuit coupled between the at least one connector and the plurality of memory devices, the at least one circuit comprising a first set of port connections coupled to respective ones of the plurality of edge connections and a second set of port connections coupled to the plurality of memory devices, each circuit of the at least one circuit further comprising a set of correction circuits, each correction circuit of the set of correction circuits being configured to make corrections in one or more signals transmitted between a respective port connection of the first set of port connections and a corresponding port connection in the second set of port connections, the each correction circuit of the set of correction circuits including at least one programmable impedance matching circuit; and control circuitry configured to receive the address and control signals from the system memory controller and to control the plurality of memory devices in response to the address and control signals, wherein the control circuitry is further configured to dynamically control the at least one programmable impedance matching circuit in the each correction circuit of the set of correction circuits in the each circuit of the at least one circuit based on which of the multiple ranks is selected to communicate data with the system memory controller in response to the address and control signals.

2. The memory module of claim 1, wherein the at least one impedance matching circuit in the each correction circuit of the set of correction circuits in the each circuit of the at least one circuit has dynamically programmable impedances whose values may differ depending on which of the multiple ranks is selected to communicate data with the system memory controller in response to the address and control signals.

3. The memory module of claim 1, wherein the at least one impedance matching circuit in the each correction circuit of the set of correction circuits in the each circuit of the at least one circuit comprises at least one network of programmable resistors that is dynamically controllable.

4. The memory module of claim 1, wherein the each correction circuit of the set of correction circuits in the each circuit of the at least one circuit further comprises one or more self-adjusting damper circuits.

5. The memory module of claim 1, wherein the each correction circuit of the set of correction circuits in the each circuit of the at least one circuit further comprises first one or more dynamically programmable repeater/amplifier elements.

6. The memory module of claim 1, wherein the each correction circuit of the set of correction circuits in the each circuit of the at least one circuit further includes a delay circuit that is configured to generate delayed versions of the signals transmitted between the respective port connection of the first set of port connections and the corresponding port connection in the second set of port connections.

7. The memory module of claim 1, wherein the number of port connections in the first set of port connections corresponds to a bit width of the memory bus.

8. The memory module of claim 1, wherein the at least one circuit comprises multiple physically separate integrated circuit packages each having a data width corresponding to a data width of one of the plurality of memory devices.

9. The memory module of claim 1, wherein the at least one circuit comprises multiple physically separate integrated circuit packages each having a data width corresponding to a data width of multiple memory devices of the plurality of memory devices.

10. The memory module of claim 1, wherein the control circuitry is configured to activate signal paths in the each circuit of the at least one circuit in response to the address and control signals.

11. The memory module of claim 1, wherein the control circuitry is configured to send at least one control signal to the at least one circuit in response to the address and control signals.

12. The memory module of claim 1, wherein the each correction circuit of the set of correction circuits in the each circuit of the at least one circuit includes one or more circuit elements, and wherein the control circuitry is configured to activate the one or more circuit elements in response to the address and control signals.

13. The memory module of claim 1, wherein each circuit in the at least one circuit has a data width of 4, 8 or 16 bits.

14. The memory module of claim 1, wherein the at least one circuit is configured to improve signal integrity in signals transmitted between the at least one connector and the plurality of memory devices.

15. The memory module of claim 1, wherein the at least one circuit is configured to improve timing of signals transmitted between the at least one connector and the plurality of memory devices.

16. The memory module of claim 1, the at least one circuit is configured to improve power consumption by signals transmitted between the at least one connector and the plurality of memory devices.

17. The memory module of claim 1, wherein the at least one circuit includes signal paths, wherein the control circuitry is configured to activate a subset of the signal paths in response to the address and control signals.

18. The memory module of claim 17, wherein the at least one circuit is further configured to provide a known static value to each port connection in the second set of port connections that is not in an active signal path.

* * * * *

UNITED STATES PATENT AND TRADEMARK OFFICE
CERTIFICATE OF CORRECTION

PATENT NO. : 10,025,731 B1
APPLICATION NO. : 14/715491
DATED : July 17, 2018
INVENTOR(S) : Lee et al.

Page 1 of 1

It is certified that error appears in the above-identified patent and that said Letters Patent is hereby corrected as shown below:

In the Claims

Claim 16, Column 18, Line 42, please delete "claim 1, the" and insert --claim 1, wherein the--.

Signed and Sealed this
Twenty-fifth Day of September, 2018

Andrei Iancu
*Director of the United States Patent and Trademark Office*